United States Patent
Kim et al.

(10) Patent No.: US 7,565,129 B2
(45) Date of Patent: Jul. 21, 2009

(54) SUPER-REGENERATIVE RECEIVER

(75) Inventors: Jeong Hoon Kim, Kyungki-Do (KR);
Tah Joon Park, Kyungki-Do (KR);
Eung Ju Kim, Kyungki-Do (KR); Joong Jin Kim, Kyungki-Do (KR)

(73) Assignee: Samsung Electro-Mechanics Co., Ltd., Suwon, Kyungki-Do (KR)

( * ) Notice: Subject to any disclaimer, the term of this patent is extended or adjusted under 35 U.S.C. 154(b) by 427 days.

(21) Appl. No.: 11/566,538

(22) Filed: Dec. 4, 2006

(65) Prior Publication Data

US 2007/0139130 A1 Jun. 21, 2007

(30) Foreign Application Priority Data

Dec. 19, 2005 (KR) ............... 10-2005-0125666

(51) Int. Cl.
*H04B 1/16* (2006.01)
(52) U.S. Cl. .............. 455/336; 455/127.1; 455/136; 455/255
(58) Field of Classification Search .............. 455/336, 455/130, 127.1, 218, 226.1, 276.1, 278.1, 455/307, 308, 311, 316
See application file for complete search history.

(56) References Cited

U.S. PATENT DOCUMENTS 4,573,212 A * 2/1986 Lipsky .............. 455/282
6,946,989 B2 * 9/2005 Vavik .............. 342/51
6,993,315 B1 * 1/2006 Frazier .............. 455/334
2006/0264196 A1 11/2006 Fan

OTHER PUBLICATIONS

UK Intellectual Property Office Search Report.

* cited by examiner

*Primary Examiner*—Tony T Nguyen
(74) *Attorney, Agent, or Firm*—Lowe Hauptman Ham & Berner

(57) ABSTRACT

A super-regenerative receiver including a super-regenerative oscillator is disclosed. The super-regenerative receiver includes a super-regenerative oscillator for generating an oscillation signal when receiving driving current exceeding a predetermined critical level. The receiver also includes a bias current controller for generating bias current according to an output of the super-regenerative oscillator, and a pulse width controller for receiving a predetermined clock and controlling a width of the clock according to the output of the super-regenerative oscillator. The super-regenerative receiver further includes a quench generator receiving the width-controlled clock from the pulse width controller and generating quench current that varies according to the pulse width of the clock. The driving current for oscillation equals to a sum of the bias current N-times multiplied and the quench current.

5 Claims, 4 Drawing Sheets

SUPER-REGENERATIVE RECEIVER

CLAIM OF PRIORITY

This application claims the benefit of Korean Patent Application No. 2005-125666 filed on Dec. 19, 2005, in the Korean Intellectual Property Office, the disclosure of which is incorporated herein by reference.

BACKGROUND OF THE INVENTION

1. Field of the Invention

The present invention relates to a super-regenerative receiver including a super-regenerative oscillator, and more particularly, a super-regenerative receiver which precisely regulates an oscillation condition of a super-regenerative oscillator to improve reception sensitivity and frequency selectivity characteristics.

2. Description of the Related Art

In general, a super-regenerative receiver can be realized with lower costs and fewer components and operated with lower voltage compared to a homodyne or super-heterodyne receiver, and thus is suitable for a communication system that requires a low-cost and low-power receiver. Such a super-regenerative receiver includes a super-regenerative oscillator.

The super-regenerative oscillator is an essential component for realizing the super-regenerative receiver and has advantages such as being operable at a very low bias current (for example, hundreds of $\mu A$) with a relatively simple structure.

In the meantime, the super-regenerative oscillator has disadvantages such as reverse isolation, sub-harmonic reaction, low reception sensitivity and frequency selectivity. The reverse isolation and sub-harmonic reaction can be overcome using an isolation preamp or an appropriate filter. However, the reception sensitivity or frequency selectivity are characteristic indices sensitive to the form and level of bias current or quench signal. Therefore, in order to improve such characteristics, not only the bias current but also the quench signal of the super-regenerative oscillator needs to be fine-tuned.

FIG. 1 is a block diagram illustrating a conventional super-regenerative receiver.

As shown in FIG. 1, the conventional super-regenerative receiver 100 includes an isolated preamplifier 110, a super-regenerative oscillator 120, an envelope detector 130, a quench generator 140 and a bias current controller 150. The isolated preamplifier 110 amplifies a signal detected from an antenna (not shown) into predetermined gains and at the same time, prevents a signal generated from the super-regenerative oscillator 120 from being delivered back to the antenna. The super-regenerative oscillator 120 receives the amplified signal from the amplifier 110 and generates an oscillation signal according to driving voltage inputted from the quench generator 140 and the bias current controller 150. The envelope detector 130 detects the oscillation signal generated from the super-regenerative oscillator 112 and generates a signal for processing a base band. The operation of the super-regenerative oscillator 120 in the conventional super-regenerative receiver 100 will be explained hereunder in more details with reference to FIG. 2.

FIG. 2 is a detailed block diagram illustrating the super-regenerative oscillator included in the receiver shown in FIG. 1.

Referring to FIG. 2, in the conventional super-regenerative receiver, the super-regenerative oscillator 120 includes an inductor-capacitor (LC) resonance part 121a, an oscillating part 121 and a current mirror part 122. The oscillating part includes a -gm part 121b (-gm meaning transconductance) which generates an oscillation signal using the LC resonance generated in the LC resonance part 121a. The current mirror part 122 provides driving current for oscillation to the -gm part 121b of the oscillating part 121.

The bias current controller 150 receives a signal from the envelope detector 130 (FIG. 1) by feedback to adjust bias current, thereby satisfying the condition for oscillation of the super-regenerative oscillator 120. The super-regenerative oscillator 120 has a predetermined critical level of oscillation, and when the current exceeding the critical level of oscillation is provided to the oscillating part 121, it generates an oscillation signal. In general, the current provided to the oscillating part 121 by the bias current Ib of the bias current controller 150 is determined at somewhat smaller value than the critical level of oscillation. Then, a quench signal Iq is added to the bias current and the resultant sum is provided as the driving current. The driving current is compared with the critical level of oscillation to determine the range of the driving current exceeding the critical level of oscillation. That is, when the quench signal Iq is added to the bias current Ib and the driving current exceeding the critical level is provided to the oscillating part 121 and thereby satisfies the oscillation condition of the oscillating part 121, oscillation begins after a some period of oscillation delay time. When the driving voltage falls back to the level below the critical level of oscillation, the oscillation is terminated. The oscillation delay time and oscillation continuation time are determined according to the range of the driving current exceeding the critical level of oscillation provided to the oscillating part 121. If the desired frequency signal is received, the oscillation delay time is shorter, and the oscillation continuation time is longer. The greater the difference between the received signal and the desired frequency, the longer the oscillation delay time is and the shorter the oscillation continuation time. Here, the envelope detector 130 (FIG. 1) determines whether the desired signal is received or not by integrating the voltage corresponding to the oscillation continuation section by the oscillation continuation time. The oscillation continuation time can be adjusted by manipulating the level of bias current. However, if the bias current is too high, the receiver reacts even to undesired signals. If the bias current is too low, the receiver may not react even to the desired signal. Therefore, the bias current needs to be adjusted to delicately regulate the range of the driving current exceeding the critical level of oscillation.

Conventionally, a current mirror part 122 is used in determining the level of driving current supplied to the oscillating part 121. The current mirror part 122 is composed of two transistors M1 and M2, and according to the ratio of the widths of the two transistors ($W_{M1}$:$W_{M2}$=1:N in FIG. 2), the level of driving current provided to the oscillating part 121 is determined. That is, the bias current Ib, supplied by the bias current regulator 150, is multiplied by N times by the current mirror part 122 and provided to the oscillating part 121, thereby determining the range exceeding the critical level of oscillation. Similarly, the quench signal Ib from the quench generator 140 is provided to the oscillating part 121 after multiplied by N times by the current mirror part 122, thereby determining the range exceeding the critical level of oscillation.

As described above, in such a conventional super-regenerative oscillator 120, the bias current Ib from the bias current regulator 150 and the quench signal Iq from the quench generator 140 are simultaneously provided to the current mirror part 122. Thus, the quench signal multiplied by N times N·Iq by the current mirror part 122 is provided to the oscillating part 121. As a result, the oscillation condition of the oscillating part 121 cannot be minutely regulated by adjusting the quench signal Iq, which may cause degradation in the reception sensitivity and frequency selectivity of the receiver.

SUMMARY OF THE INVENTION

The present invention has been made to solve the foregoing problems of the prior art and therefore an object of certain embodiments of the present invention is to provide a super-regenerative receiver which precisely regulates the oscillation condition of a super-regenerative oscillator, thereby improving the characteristics related to the reception sensitivity and frequency selectivity thereof.

According to an aspect of the invention for realizing the object, there is provided a super-regenerative receiver including: a super-regenerative oscillator for generating an oscillation signal when receiving driving current exceeding a predetermined critical level; a bias current controller for generating bias current according to an output of the super-regenerative oscillator; a pulse width controller for receiving a predetermined clock and controlling a width of the clock according to the output of the super-regenerative oscillator; and a quench generator receiving the width-controlled clock from the pulse width controller and generating quench current that varies according to the pulse width of the clock, wherein the driving current equals to a sum of the bias current N-times multiplied and the quench current.

According to an embodiment of the present invention, the super-regenerative oscillator includes: an oscillation part for generating an oscillation signal using inductor-capacitor (LC) resonance when the driving current exceeds the critical level; and a current mirror part multiplying the bias current by N times, whereby the sum of the N-times multiplied bias current outputted from the current mirror part and the quench current from the quench generator is provided to the oscillation part as the driving current.

The current mirror part includes a first transistor having a drain, a gate connected to the gate and a source grounded, the first transistor receiving the bias current through the drain thereof; and a second transistor having a gate connected to the gate of the first transistor and a source grounded, the second transistor having a width N times that of the first transistor, and wherein the N-times multiplied bias current is generated at the drain of the second transistor.

According to an embodiment of the present invention, the pulse width controller is adapted to maintain a period of the clock and control the width of low and high values of the clock, and the quench generator is adapted to generate the quench current having a predetermined shape corresponding to the low and high values of the clock controlled by the pulse width controller.

Preferably, the quench current has a triangle wave or saw tooth wave.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE PREFERRED EMBODIMENT

Figure 1:
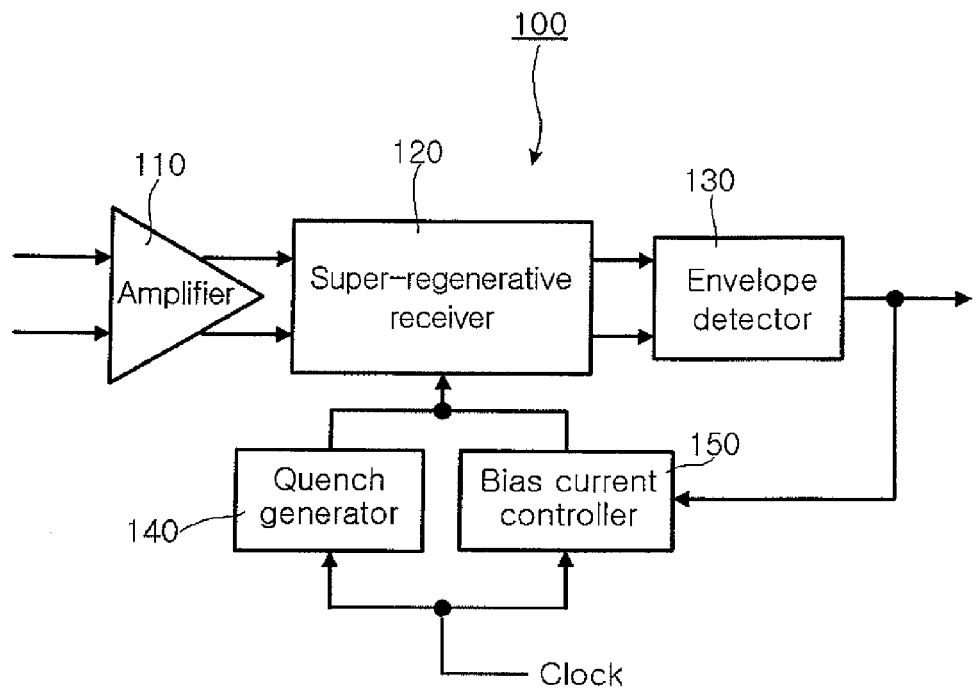
FIG. 1 is a block diagram illustrating a conventional super-regenerative receiver.
Figure 2:
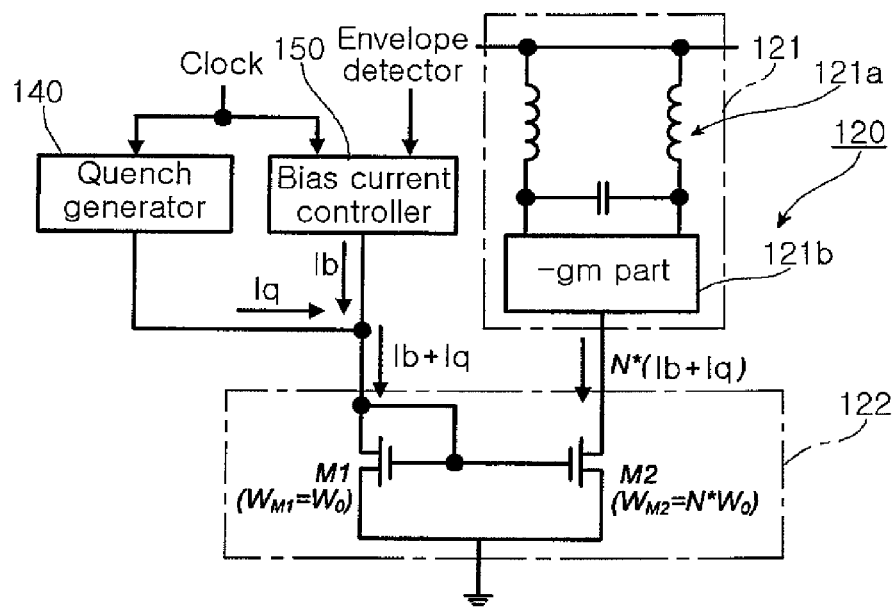
FIG. 2 is a detailed block diagram illustrating a super-regenerative oscillator included in the receiver shown in FIG. 1.

Preferred embodiments of the present invention will now be described in detail with reference to the accompanying drawings. The invention may however be embodied in many different forms and should not be construed as limited to the embodiments set forth herein. Rather, these embodiments are provided so that this disclosure will be thorough and complete, and will fully convey the scope of the invention to those skilled in the art. In the drawings, the shapes and dimensions may be exaggerated for clarity, and the same reference numerals are used throughout to designate the same or similar components.

Figure 3:
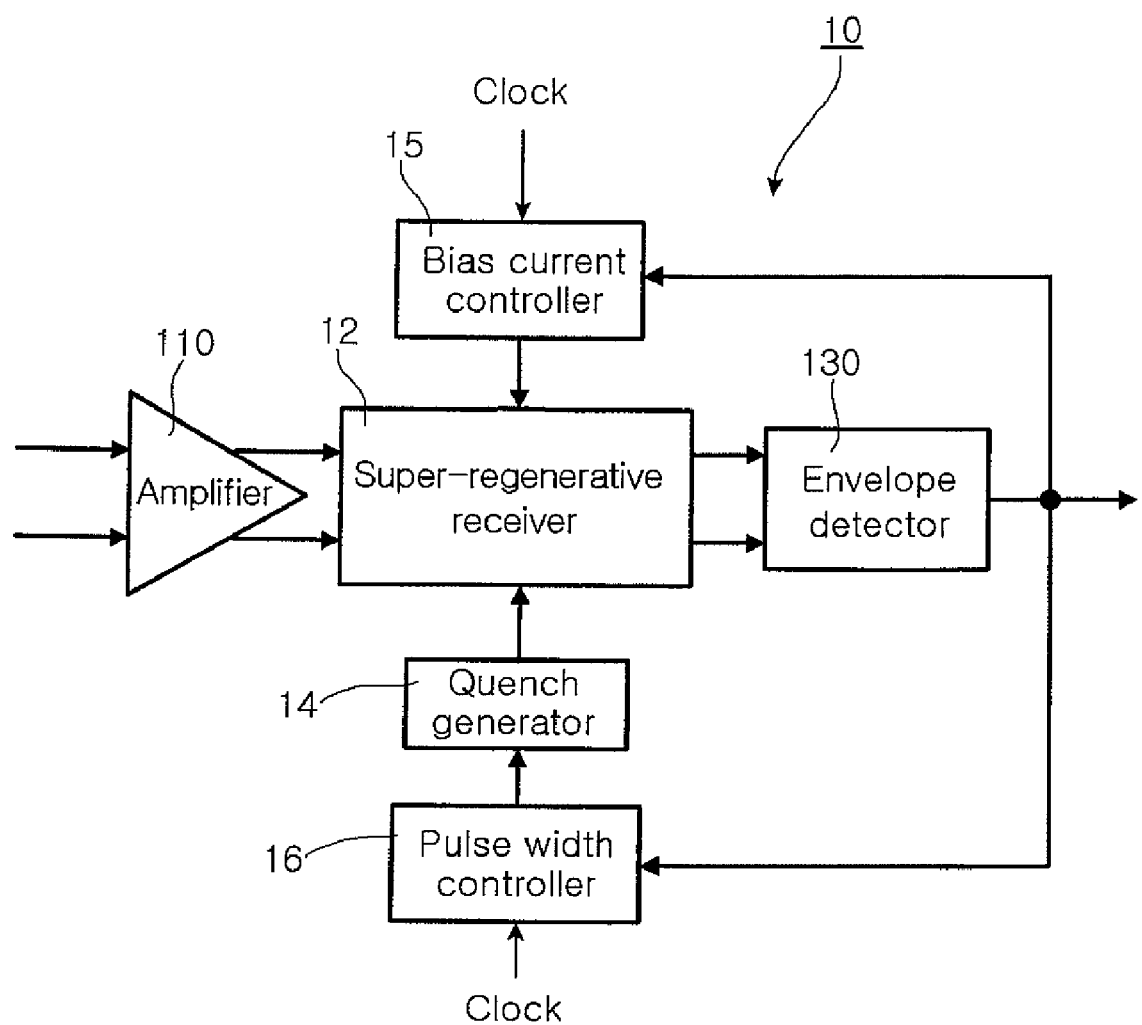
FIG. 3 is a block diagram illustrating a super-regenerative receiver according to an embodiment of the present invention.

FIG. 3 is a block diagram illustrating a super-regenerative receiver according to an embodiment of the present invention.

Referring to FIG. 3, the super-regenerative receiver 10 according to an embodiment of the present invention includes an isolated preamplifier 110, a super-regenerative oscillator 12, a bias current controller 15, a pulse width controller 16 and a quench generator 14. The isolated preamplifier 110 amplifies an RF signal received through an antenna (not shown), and the super-regenerative oscillator 12 generates an oscillation signal in response to an input of driving current exceeding a predetermined critical level when the RF signal is received by the isolated preamplifier 110. The bias current controller 15 generates bias current Ib according to an output of the super-regenerative oscillator 12. The pulse width controller 16 receives a predetermined clock and controls a width of the clock according to the output of the super-regenerative oscillator 12. The quench generator 14 receives the width-controlled clock from the pulse width controller 16 and generates quench current Iq varying in accordance with the pulse width of the clock. According to this embodiment, the super-regenerative receiver 10 may further include an envelope detector 130 which detects an envelope in the oscillation signal outputted from the super-regenerative oscillator 12. The bias current controller 15 regulates the bias current according to an output of the envelope detector 130. In addition, the pulse width controller 16 regulates the pulse width of the clock to regulate the quench current in accordance with the output of the envelope detector 130.

Figure 4:
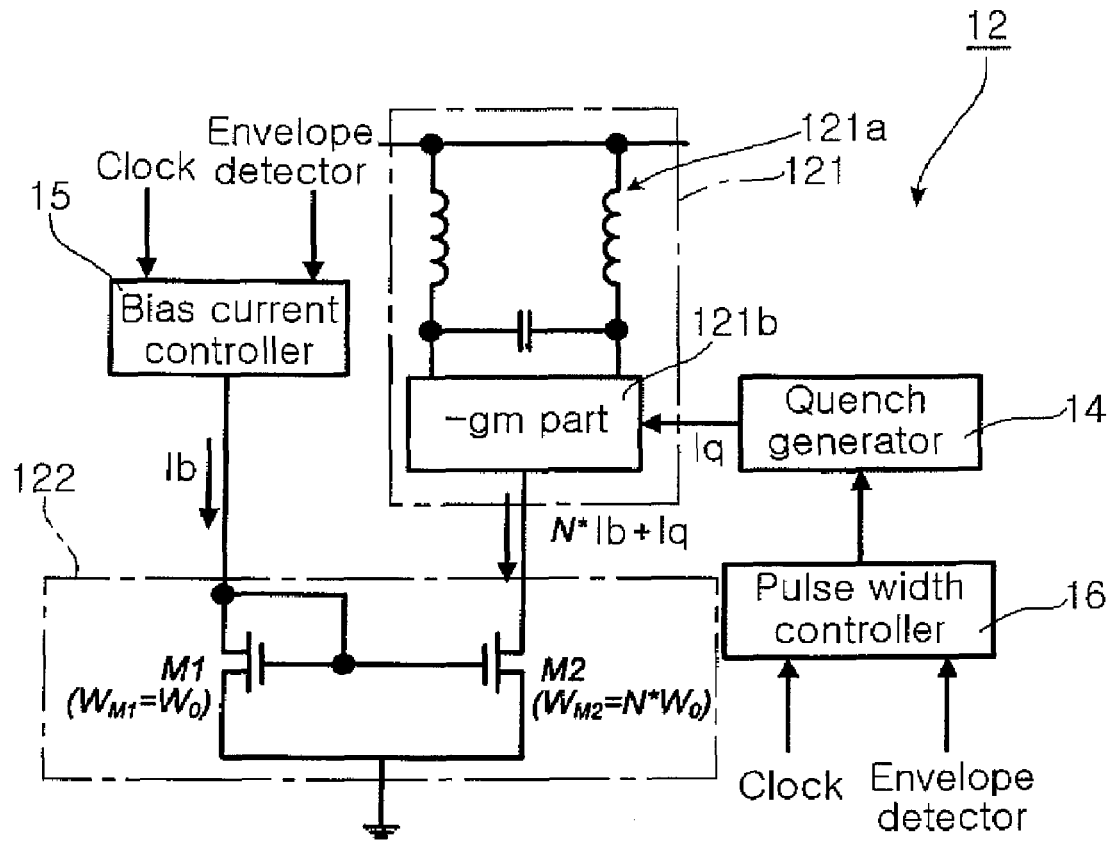
FIG. 4 is a detailed block diagram illustrating a super-regenerative oscillator included in the receiver shown in FIG. 3.

FIG. 4 is a detailed block diagram illustrating the super-regenerative oscillator included in the super-regenerative receiver shown in FIG. 3.

Referring to FIG. 4, the super-regenerative oscillator includes an oscillating part 121 for generating the oscillation signal using inductor-capacitor (LC) resonance when the driving current exceeds the critical level; and a current mirror part 122 for multiplying the bias current provided from the bias current controller 15 by N times.

The oscillating part 121 includes an LC resonance part 121*a* which generates LC resonance with an inductor and a capacitor; and a -gm part 121*b* which sets -gm (transconductance) when the driving current exceeds the critical level, thereby generating the oscillation signal using the LC resonance.

The current mirror part 122 consists of two transistors M1 and M2 having different widths WM1 and WM2. They are connected to each other through respective gates with their respective sources grounded. The first transistor M1 has a gate and a drain connected to the gate, and receives the bias current outputted from the bias current controller 15 through the drain thereof. The second transistor M2 has a width $W_{M2}=N \cdot W_{M1}$ which is N times greater than that $W_{M1}$ of the first transistor M1. Therefore, the bias current Ib received through the drain of the first transistor M1 is multiplied by N times to produce a bias current N-times multiplied N·Ib, which travels through the gate of the second transistor M2. Thus, the bias current N-times multiplied N·Ib is provided to the -gm part 121b of the oscillating part 121.

In the meantime, the pulse width controller 16 receives a clock having a predetermined period and controls widths of low and high sections of the clock while maintaining the period of the clock according to the signal outputted from the envelope detector 130 (FIG. 3). The quench generator 14 generates the quench current Iq having a predetermined shape corresponding to the low or high section of the clock controlled by the pulse width controller 16. The quench current may be a triangle wave or a saw tooth wave. The quench current Iq is provided to the -gm part 121b in addition to the N-times multiplied bias current N·Ib. Therefore, the driving current provided to the oscillating part 121 equals to a sum N·Ib+Iq of the bias current N-times multiplied N·Ib and the quench current Iq.

Figure 5:
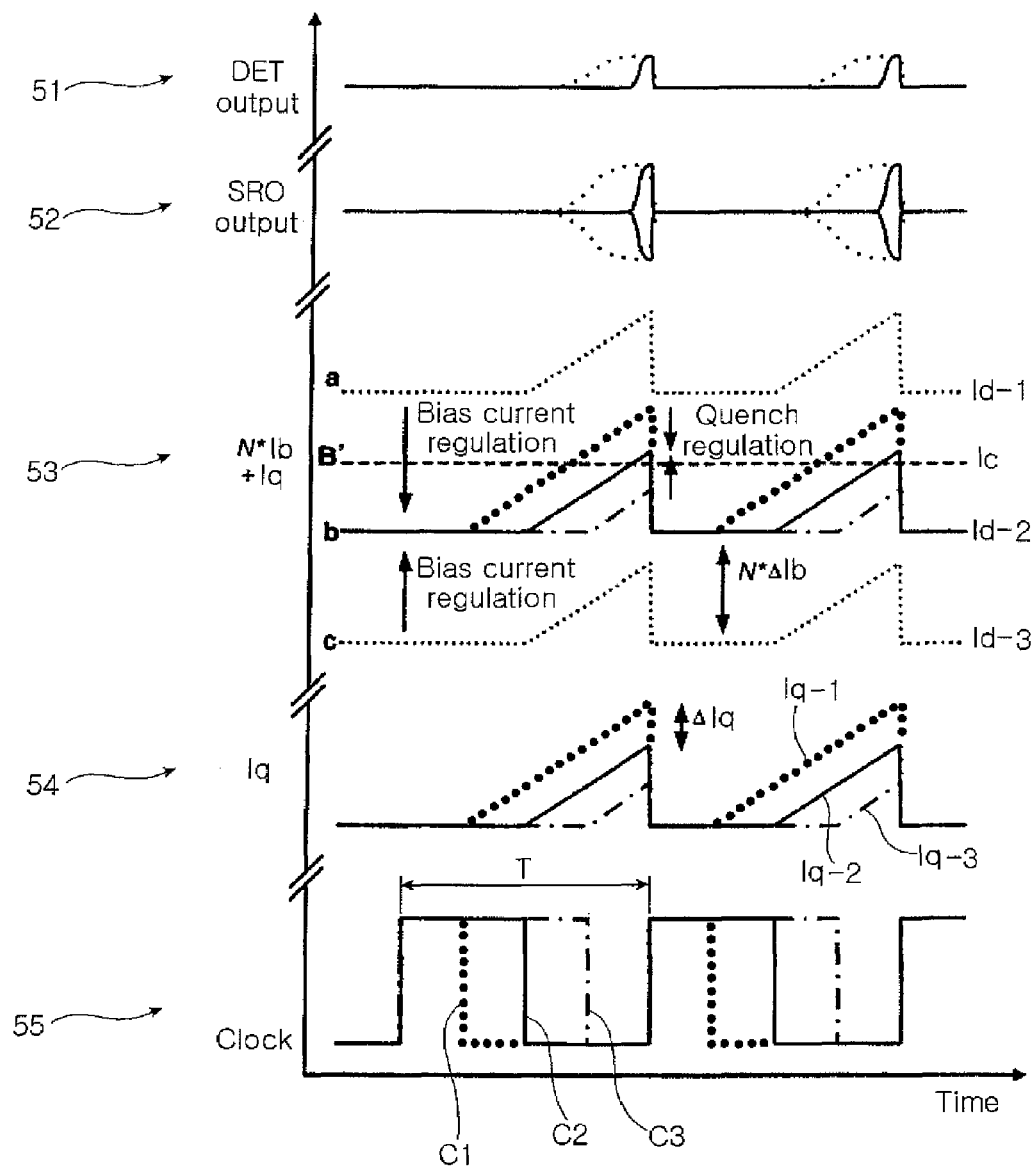
FIG. 5 is a timing chart illustrating the operation of the super-regenerative receiver according to the present invention.

FIG. 5 is a timing chart for explaining the operation of the super-regenerative receiver according to the present invention. The operation of the super-regenerative receiver according to the present invention will now be explained in detail with reference to FIGS. 3 to 5.

In FIG. 5, the diagram denoted by reference numeral 51 represents the output of the envelope detector 130, and the diagram denoted by reference numeral 52 represents the output of the super-regenerative oscillator 12. In addition, the diagram denoted by reference numeral 53 represents the relationship between the critical level Ic, the bias current Ib and the quench current Iq for oscillation of the super-regenerative oscillator 12. The diagrams denoted by reference numerals 54 and 55 show the relationship between the pulse width of the clock controlled by the pulse width controller 16 and the quench current.

With reference to the diagrams denoted by reference numerals 54 and 55, generation of the quench current Iq is explained. The pulse width controller 16 receives a waveform outputted from the envelope detector 130 and controls the pulse width of the clock according to the waveform to yield a desired output. As shown in the diagram denoted by reference numeral 55, the pulse width controller 16 adjusts the widths of the low and high sections of the clock while maintaining a predetermined period T of the clock. The pulse width controller 16 controls the width, for example, by lengthening the low section of the clock as indicated by the dotted line C1, or by lengthening the high section of the clock as indicated by the dotted line C3.

Then, the quench generator 14 receives the clock with the pulse width controlled by the pulse width controller 16 and generates a predetermined shape of quench current Iq according to the pulse width of the clock received. In this embodiment, the quench current Iq, a triangle wave, is generated corresponding to the low sections of the clock. For example, when the clock indicated by C1 is received by the quench generator 14 from the pulse width controller 16, the quench current denoted by Iq-1 can be generated. Similarly, when the clock denoted by C2 is received, the quench current denoted by Iq-2 can be generated. In addition, when the clock denoted by C3 is received, the quench current denoted by Iq-3 is generated in the quench generator 14. In other words, when the low section of the clock is lengthened by the pulse width controller 16, larger quench current is generated.

In the meantime, the bias current Ib is multiplied by N times according to the ratio of the widths of the two transistors of the current mirror part 122 and provided to the oscillating part 121. In the present invention, the bias current N-times multiplied N·Ib plus the quench current Iq is provided as the driving current With reference to the diagram denoted by the reference numeral 53, the N-times multiplied bias current N·Ib contributes to adjusting the total level of the driving current while the quench current Iq contributes to fine tuning of the driving current according to the magnitude of the triangle wave at the set total level of the driving current. That is, the level of the driving current is adjusted at Id-1, Id-2 or Id-3 by the bias current N-times multiplied N·Ib. Once the appropriate level is set at Id-2, the magnitude of the quench current Iq is adjusted up or down to minutely regulate the range exceeding the critical level IC for oscillation.

By regulating the quench current in such a way, the range of the driving current exceeding the critical level Ic is minutely regulated. Within the range of the driving current exceeding the critical level, the oscillation takes place as indicated in the diagram denoted by reference numeral 52, and the envelope detector obtains the output detected in the positive (+) range of the oscillation signal.

A comparison is made hereunder between the above-described super-regenerative receiver and the conventional super-regenerative receiver.

First, the super-regenerative receiver according to the present invention uses the sum N·Ib+Iq of N-times multiplied bias current N·Ib, outputted from the bias current controller, and the quench current Iq adjusted in its magnitude according to the pulse width of the clock controlled by the pulse width controller.

On the other hand, in the conventional super-regenerative receiver, the bias current Ib and the quench current Iq are provided together to the current mirror part, and thus the driving current equals to the bias current Ib and the quench current Iq summed up and then multiplied by N times N·(Ib+Iq).

Therefore, given the same value of the bias current Ib and that the quench current Iq is adjustable by the same resolution Δ Iq, the conventional super-regenerative receiver can adjust the driving current by a unit of N·ΔIq by adjusting the quench current while the super-regenerative receiver according to the present invention can adjust the driving current by a unit of Δ Iq by adjusting the quench current.

Therefore, compared with the conventional super-regenerative receiver, the adjustable resolution of the quench current is improved according to the present invention, thereby allowing more precise adjustment of the oscillation condition of the super-regenerative receiver. This in turn enhances reception sensitivity for sensing small signals and frequency selectivity for selectively detecting a desired frequency region.

As set forth above, the super-regenerative receiver of the present invention is adapted to adjust the pulse width of a clock according to an output from the super-regenerative oscillator to more precisely adjust a quench signal. In addition, driving current of the oscillator is adjusted by a finer level, thereby more precisely adjusting the oscillation condition of the super-regenerative receiver. This in turn improves the reception sensitivity for sensing small signals as well as frequency selectivity for selectively detecting the desired frequency region.

While the present invention has been shown and described in connection with the preferred embodiments, it will be apparent to those skilled in the art that modifications and variations can be made without departing from the spirit and scope of the invention as defined by the appended claims.

What is claimed is:

1. A super-regenerative receiver comprising:
    a super-regenerative oscillator for generating an oscillation signal when receiving driving current exceeding a predetermined critical level;
    a bias current controller for generating bias current according to an output of the super-regenerative oscillator;
    a pulse width controller for receiving a predetermined clock and controlling a width of the clock according to the output of the super-regenerative oscillator; and
    a quench generator receiving the width-controlled clock from the pulse width controller and generating quench current that varies according to the pulse width of the clock,
    wherein the driving current equals to a sum of the bias current N-times multiplied and the quench current.

2. The super-regenerative receiver according to claim 1, wherein the super-regenerative oscillator comprises:
    an oscillation part for generating an oscillation signal using inductor-capacitor (LC) resonance when the driving current exceeds the critical level; and
    a current mirror part multiplying the bias current by N times,
    whereby the sum of the N-times multiplied bias current outputted from the current mirror part and the quench current from the quench generator is provided to the oscillation part as the driving current.

3. The super-regenerative receiver according to claim 2, wherein the current mirror part comprises:
    a first transistor having a drain, a gate connected to the gate and a source grounded, the first transistor receiving the bias current through the drain thereof; and
    a second transistor having a gate connected to the gate of the first transistor and a source grounded, the second transistor having a width N times that of the first transistor, and
    wherein the N-times multiplied bias current is generated at the drain of the second transistor.

4. The super-regenerative receiver according to claim 1, wherein the pulse width controller is adapted to maintain a period of the clock and control the widths of low and high sections of the clock, and
    the quench generator is adapted to generate the quench current having a predetermined shape corresponding to the low or high section of the clock controlled by the pulse width controller.

5. The super-regenerative receiver according to claim 4, wherein the quench current has a triangle wave or saw tooth wave.

* * * * *